United States Statutory Invention Registration [19]

[11] Reg. Number: H310

Johnson [43] Published: Jul. 7, 1987

[54] ANALOG MULTIPLEXER

[75] Inventor: William V. Johnson, Beavercreek, Ohio

[73] Assignee: The United States of America as represented by the Secretary of the Navy, Washington, D.C.

[21] Appl. No.: 880,621

[22] Filed: Jun. 13, 1986

[51] Int. Cl.[4] ..... H04J 3/02

[52] U.S. Cl. ..... 370/114; 370/112

[56] References Cited

U.S. PATENT DOCUMENTS

| | | | |
|---|---|---|---|
| 4,017,687 | 4/1977 | Hartzler et al. | 179/15 A |
| 4,075,608 | 2/1978 | Koenig | 340/166 R |
| 4,097,693 | 6/1978 | Greefkes | 179/15 AT |
| 4,146,750 | 3/1979 | Spiesman | 179/15 A |
| 4,446,552 | 5/1984 | Tweedy | 370/58 |

*Primary Examiner*—Stephen C. Buczinski
*Assistant Examiner*—Linda J. Wallace
*Attorney, Agent, or Firm*—Robert F. Beers; W. Thom Skeer

[57] ABSTRACT

A fast analog multiplexer is disclosed which utilizes a plurality of parallel MOSFETs coupled to a plurality of parallel analog inputs, the gates of said MOSFETs being controlled by a binary decoder to allow passage of only on analog voltage to be summed by an op amp while concomitantly shorting other analog voltages to ground, thereby attenuating the delaying summed capacitive effects of stacked parallel MOSFETs.

1 Claim, 1 Drawing Figure

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

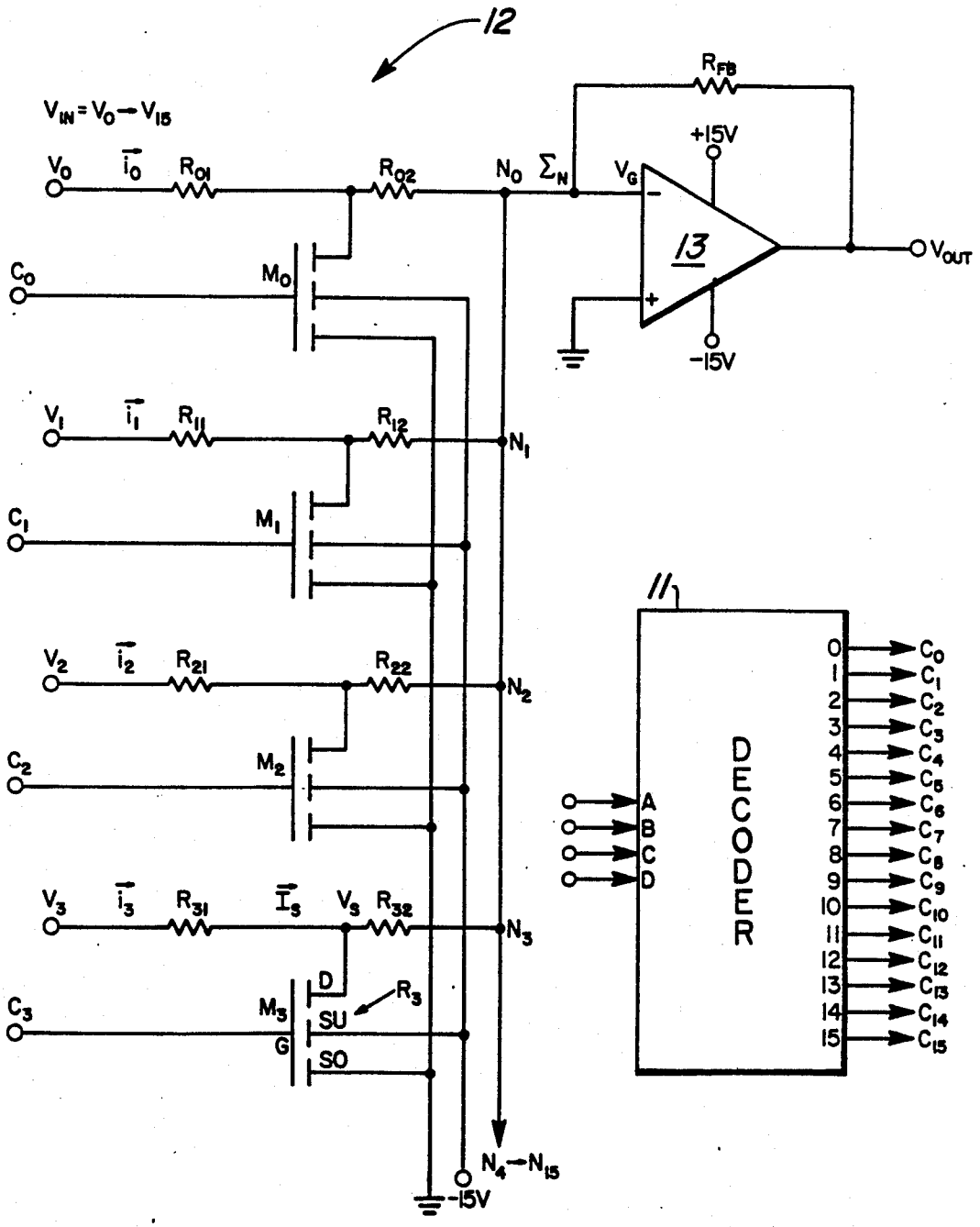
12
$V_{IN} = V_0 \rightarrow V_{15}$
$V_0$
$\vec{i}_0$
$R_{01}$
$R_{02}$
$N_0$
$\Sigma_N$
$V_G$
$R_{FB}$
+15V
13
$V_{OUT}$
-15V
$C_0$
$M_0$
$V_1$
$\vec{i}_1$
$R_{11}$
$R_{12}$
$N_1$
$C_1$
$M_1$
$V_2$
$\vec{i}_2$
$R_{21}$
$R_{22}$
$N_2$
$C_2$
$M_2$
$V_3$
$\vec{i}_3$
$R_{31}$
$\vec{I}_3$
$V_3$
$R_{32}$
$N_3$
$C_3$
$M_3$
D
SU
SO
G
$R_3$
$N_4 \rightarrow N_{15}$
-15V
11
DECODER
A
B
C
D
0 $C_0$
1 $C_1$
2 $C_2$
3 $C_3$
4 $C_4$
5 $C_5$
6 $C_6$
7 $C_7$
8 $C_8$
9 $C_9$
10 $C_{10}$
11 $C_{11}$
12 $C_{12}$
13 $C_{13}$
14 $C_{14}$
15 $C_{15}$

ANALOG MULTIPLEXER

BACKGROUND OF THE INVENTION

1. Field of the Invention

This invention relates to the field of electronics. More specifically, the invention is directed to a circuit for a high speed analog multiplexer for data acquisition systems.

1. Description of the Prior Art

Analog multiplexers generally allow one of many signals to pass. This function lets many channels share one analog-to-digital, A/D, converter in a time slice fashion. Since the analog to digital converter is often the most expensive part of a data acquisition system, the ability to share the converter can significantly reduce the system cost. Known analog multiplexers provide a low resistance path from input to output for the chosen channel and a high resistance path to all other channels. Existing systems generally use analog switches comprised of parallel pairs of complementary channel MOSFETs. The outputs of such systems are all tied together to provide a single output. The sum of all MOSFET drain and source capacitances from all the off channels however, is seen at the output. Such an approach creates settling times that are too long to take advantage of state of the art analog-to-digital converters. Hence, current analog multiplexers have become the limiting factor in economical data acquisition system advancement.

Thus, there exists a continuing need for a faster analog multiplexer not limited by MOSFET source/drain capacitive discharge settling times to more efficiently take advantage of fast state-of-the-art analog-to-digital converters.

SUMMARY OF THE INVENTION

A high speed analog multiplexer circuit has a plurality of analog voltage inputs coupled through an equal number of series pairs of resistors to the inverting input of an op amp; the noninverting input of said op amp being coupled to ground. An equal plurality of MOSFETs coupled in parallel with each other are coupled between each respective resistor pair (source) to a common ground (drain). The gates of each said MOSFETs are coupled in parallel to a 4 bit binary decoder, and the substrates of each MOSFET are coupled in parallel to a −15 volt power source. A feedback resistor couples the output of the op amp to an analog voltage suimming node at the inverting input of the op amp. The decoder operates at a very high speed on the gates of each MOSFET concurrently, setting only one selected gate low (turning it off) while all other such gates are asserted high. The effect being that only one analog input is passed to the op amp while all other analog inputs are shorted to ground through the conducting MOSFETs.

OBJECT OF THE INVENTION

It is a primary object of the invention to provide a higher speed analog multiplexer than exist in the art.

A further object of the invention is to provide an analog multiplexer comprising fewer components, especially A/D converters, than exist in the art.

Yet another object of the invention is to provide an analog multiplexer greatly reduced cost.

These and further objects and more advantageous features of the present invention will become more readily apparent in view of the attached drawing illustrating a description of a preferred embodiment as described herein.

BRIEF DESCRIPTION OF THE DRAWING

The FIGURE illustrates a schematic of a preferred embodiment of the invention.

DESCRIPTION OF A PREFERRED EMBODIMENT

The invention employs a novel modification of an analog adder circuit. Referring to the FIGURE, a selected analog input signal, e.g. $V_3$, is passed to a summing node ($\Sigma n$) while the other analog input signals (i.e. $V_0$ through $V_2$ and $V_4$ through $V_{15}$) in such a manner as to protect signal source summing node $\Sigma n$ from also being grounded. Not only the portion of the circuit processing $V_0$ through $V_3$ is illustrated in the FIGURE since it would be obvious and redundant to show all 15 MOSFETs. All MOSFETs in this embodiment operate in the same manner as the four illustrated.

In the operational circuit illustrated a four-to-sixteen decoder 11, which may be a, 54HC154 will provide a low to one C output, e.g. $C_3$ corresponding to a binary number input A B C D to decoder 11. The $C_0$ through $C_{15}$ outputs of decoder 11 are sequentially coupled to $C_0$ through $C_{15}$ inputs of a summing branch circuit 12. Summing branch circuit 12 comprises sixteen parallel MOSFETs, which may be of the same type, designated 5D5000, of which only are shown $M_0$ through $M_3$, yielding outputs at nodes $N_0$ through $N_{15}$. Only $N_0$ through $N_3$ are shown.

Considering the operation of a single section, a low asserted on, $C_3$ will hold the gate (G) of $M_3$ low, which will no longer permit current to flow from the drain (D) through the substrate (SU) to the source (SO) "ground" of MOSFET $M_3$, thereby effectively turning off $M_3$. Concurrently, all other outputs $C_0$ through $C_2$ and $C_4$ through $C_{15}$ of decoder 11 will be held high, and thereby holding the gates of $M_0$ through $M_2$ and $M_4$ through $M_{15}$ high, and holding $M_0$ through $M_2$ and $M_4$ through $M_{15}$ in an on state, effectively passing $V_0$ through $V_2$ and $V_4$ through $V_{15}$ analog signals to ground.

For clarity of understanding, MOSFETs $M_0$ through $M_{15}$ can be modeled as a variable resistance when turned off. In considering the path for $V_3$, $V_G$ is a virtual ground present at the inverting input to an op amp 13 due to feedback through a feedback resistor $R_{FB}$. Op amp 13 may be a CL200 if desire. Each input channel represented by input signals $V_0$ through $V_{15}$ provides a current (i) to $V_G$. The sum of these currents times $R_B$ gives the output voltage $V_{out}$ of op amp 13.

All resistors illustrated in the circuit other than $R_{FB}$ are 100K Ω, and $R_{FB}$=200K Ω.

Although there has been described hereinabove a particular arrangement of an analog multiplexer circuit for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of the invention as defined in the appended claim.

What is claimed is:

1. An analog multiplexer, comprising:

an op amp having an inverted and noninverting input and an output and further having a summing node coupled to said inverting input and a feedback resistor coupling said output to said inverting input;

at least two analog inputs each having a resistance coupling to said summing nodes;

an equal number of MOSFETs as said analog inputs, each said MOSFET having a drain, a source, a substrate, and a gate, said drain of each said MOSFET being connected to said resistance coupling, said source of each said MOSFET being only coupled to a common signal return, and said substrate of each said MOSFET being coupled to power source;

decoder-driving means having a plurality of digital inputs and a plurality of driver outputs, said driver outputs being equal in number to said MOSFETs, each said driver output being coupled to said gates of each said respective MOSFET, for receiving a digital command input, and for driving one said gate of each said MOSFET low and driving said gates of all other MOSFETs high.

* * * * *